(12) United States Patent
Wang et al.

(10) Patent No.: US 8,642,450 B2
(45) Date of Patent: Feb. 4, 2014

(54) LOW TEMPERATURE JUNCTION GROWTH USING HOT-WIRE CHEMICAL VAPOR DEPOSITION

(75) Inventors: Qi Wang, Littleton, CO (US); Matthew Page, Littleton, CO (US); Eugene Iwaniczko, Lafayette, CO (US); Tihu Wang, Littleton, CO (US); Yanfa Yan, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 805 days.

(21) Appl. No.: 12/742,001

(22) PCT Filed: Nov. 9, 2007

(86) PCT No.: PCT/US2007/084252
§ 371 (c)(1),
(2), (4) Date: May 7, 2010

(87) PCT Pub. No.: WO2009/061322
PCT Pub. Date: May 14, 2009

(65) Prior Publication Data
US 2010/0263717 A1    Oct. 21, 2010

(51) Int. Cl.
*H01L 21/20* (2006.01)
*H01L 21/36* (2006.01)

(52) U.S. Cl.
USPC .................. 438/478; 136/252; 136/258

(58) Field of Classification Search
USPC ............. 136/252–258; 257/756; 438/478
See application file for complete search history.

(56) References Cited

U.S. PATENT DOCUMENTS

| | | | |
|---|---|---|---|
| 5,125,984 A * | 6/1992 | Kruehler et al. | 136/255 |
| 5,397,737 A | 3/1995 | Mahan et al. | |
| 6,251,183 B1 | 6/2001 | Iwancizko et al. | |
| 6,746,709 B2 | 6/2004 | Lauinger et al. | |
| 7,300,890 B1 | 11/2007 | Wang | |
| 2005/0150542 A1 | 7/2005 | Madan | |
| 2006/0108688 A1 | 5/2006 | Richardson | |

FOREIGN PATENT DOCUMENTS

KR  10-2007-0090235   9/2007
WO       2006066544   6/2006

OTHER PUBLICATIONS

International Search Report dated Jul. 23, 2008, for International Application No. PCT/US07/84252.
T.H. Wang et al, 17.5% p-Type Silicon Heterojunction Solar Cells with HWCVD a-Si:H as the Emitter and Back Contact, Presented at the 2005 DOE Solar Energy Technologies Program review meeting Nov. 2005.
Q. Wang et al, Hot-Wire CVD N-Type Emitter on P-Type Crystalline Si Solar Cell, Photovoltaic Energy Conversion, 2003. Proceedings of 3rd World Conference, May 12-16, 2003, vol. 2, pp. 1427-1430.
T.H. Wang et al, Effective Interfaces in Silicon Heterojunction Solar Cells, IEEE Photovoltaics Specialists Conference and Exhibition, Lake Buena Vista, FL, Jan. 3-7, 2005.
M.K. van Veen, Hot-wire deposited intrinsic amorphous silicon in Tandem solar cells deposited using hot-wire chemical vapor deposition, University of Utrecht doctoral thesis, May 28, 2003.

* cited by examiner

*Primary Examiner* — Kimberly Rizkallah
*Assistant Examiner* — Errol Fernandes
(74) *Attorney, Agent, or Firm* — Paul J. White (57) ABSTRACT

A system and a process for forming a semi-conductor device, and solar cells (10) formed thereby. The process includes preparing a substrate (12) for deposition of a junction layer (14); forming the junction layer (14) on the substrate (12) using hot wire chemical vapor deposition; and, finishing the semi-conductor device.

14 Claims, 13 Drawing Sheets

LOW TEMPERATURE JUNCTION GROWTH USING HOT-WIRE CHEMICAL VAPOR DEPOSITION

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

BACKGROUND

Many methods exist for the formation in or on a substrate of a semi-conductor junction, as for example of the p-n-type, for use in a variety of industrial applications such as those involving electrically conductive or semi-conductor devices, and in some particular examples, in the manufacture of photovoltaic or solar cells. A number of these methods have typically been performed in batch diffuse furnaces at high temperatures. Often however, such conventional high temperature processes can negatively affect the characteristics of the substrate, particularly if of a silicon substrate or base, and/or may simply involve a long dedicated time period within the overall process. When the substrate is a silicon (Si) wafer, such high temperatures may degrade the Si wafer.

In some conventional processes, a batch diffuse furnace process has typically been used, which is a high temperature (800-900° C.) process involving introduction of a phosphoryl chloride (commonly called phosphorus oxychloride), $POCl_3$, gas into the furnace in which a number of silicon wafers are disposed. Such wafers may typically have been previously doped with boron to create a p-type substrate, and during the diffuse furnace process, phosphorus from the $POCl_3$ diffuses into the wafer to form an n-type layer of the substrate wafer adjacent a p-type portion of substrate wafer, the p-type portion being the remainder of the wafer having the boron disposed therein, and not having been penetrated by the phosphorus atoms. In the semiconductor and photovoltaics industries, $POCl_3$ is used as a substantially safe liquid or gas phosphorus source for diffusion processes. The phosphorus acts as a dopant used to create N-type layers on a silicon wafer. Then, after removal from such a furnace of the wafers with junctions formed therein, a thin film silicon nitride ($SiN_x$) layer may be added as a passivation and/or anti-reflection layer on the wafer.

The foregoing examples of the related art and limitations related therewith are intended to be illustrative and not exclusive. Other limitations of the related art will become apparent to those of skill in the art upon a reading of the specification and a study of the drawings.

SUMMARY

The following implementations and aspects thereof are described and illustrated in conjunction with systems, tools and methods which are meant to be exemplary and illustrative, not limiting in scope. In various implementations, one or more of the above-described issues have been reduced or eliminated, while other implementations are directed to other improvements.

An exemplary process for forming a semi-conductor may comprise preparing a substrate for deposition of a junction layer; and forming the junction layer using hot wire chemical vapor deposition to deposit the junction layer on the substrate. This exemplary process facilitates the formation of a semi-conductor cell product or products.

A further exemplary semi-conductor cell comprises a semi-conductor substrate; and a semi-conductor junction layer hot wire chemical vapor deposited on the substrate.

An exemplary system for the production of semi-conductor cells is also disclosed having substrates, and one or both of HWCVD deposited junction layers and deposited passivation layers; the system including a conveyance apparatus for conveying one or both of a substrate and a semi-conductor cell; a chamber for deposition formation of one or both of a HWCVD deposited junction layer and a deposited passivation layer on a substrate.

Another exemplary process is disclosed for depositing a junction layer on a substrate, comprising the operations of providing a HWCVD chamber, introducing the substrate into the chamber, passing a source gas into the chamber, decomposing the source gas by the HWCVD technique in the chamber and forming a junction layer on the substrate.

In view of the foregoing it is a general aspect of the presently described developments to provide a low temperature process to grow a junction and/or a passivation layer on a substrate.

Another aspect hereof may include the provision of a low temperature hot-wire chemical vapor deposition process to grow a silicon-based junction on a single crystalline or poly-crystalline substrate.

Yet another aspect may include the provision of a low temperature hot-wire chemical vapor deposition process to grow a silicon-based junction on a single crystalline or poly-crystalline substrate together with a low temperature hot-wire chemical vapor deposition process to grow a silicon-based passivation layer over the junction.

The foregoing specific aspects and advantages are illustrative of those which can be achieved hereby and are not intended to be exhaustive or limiting of the possible advantages which can be realized. Thus, those and other aspects and advantages hereof will be apparent from the description herein or can be learned from practicing the developments hereof, both as embodied herein or as modified in view of any variations which may be apparent to those skilled in the art. Thus, in addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting. In the drawings:

FIG. 1, which includes sub-part FIGS. 1a and 1b, provides schematic isometric diagrams of a semi-conductive device hereof;

FIG. 7 is one further schematic flow chart of yet still another alternative process for fabricating semi-conductive devices;

DESCRIPTION

Presented here is an efficient fabrication process for semiconductor devices such as photovoltaic cells. More particularly, processes are described here for fabrication of highly efficient crystalline silicon (c-Si) photovoltaic or solar cells using low temperature, e.g., less than about 250° C., growth of thin crystalline silicon (c-Si) or poly silicon (poly-Si) junctions (homo or hetero) and SiN$_x$ passivation layers; or growth of low-temperature, e.g., less than about 650° C., thick epitaxial Si junctions (homo or hetero) and less than about 250° C. SiN$_x$ passivation layers by the hot-wire chemical vapor deposition (HWCVD) technique. Briefly, the process provides for depositing a junction layer on a crystalline substrate, generally including the operations of preparing the substrate, depositing the junction layer and optionally also the passivation layer and finishing by connecting the contacts and typically also annealing.

Figure 1A:
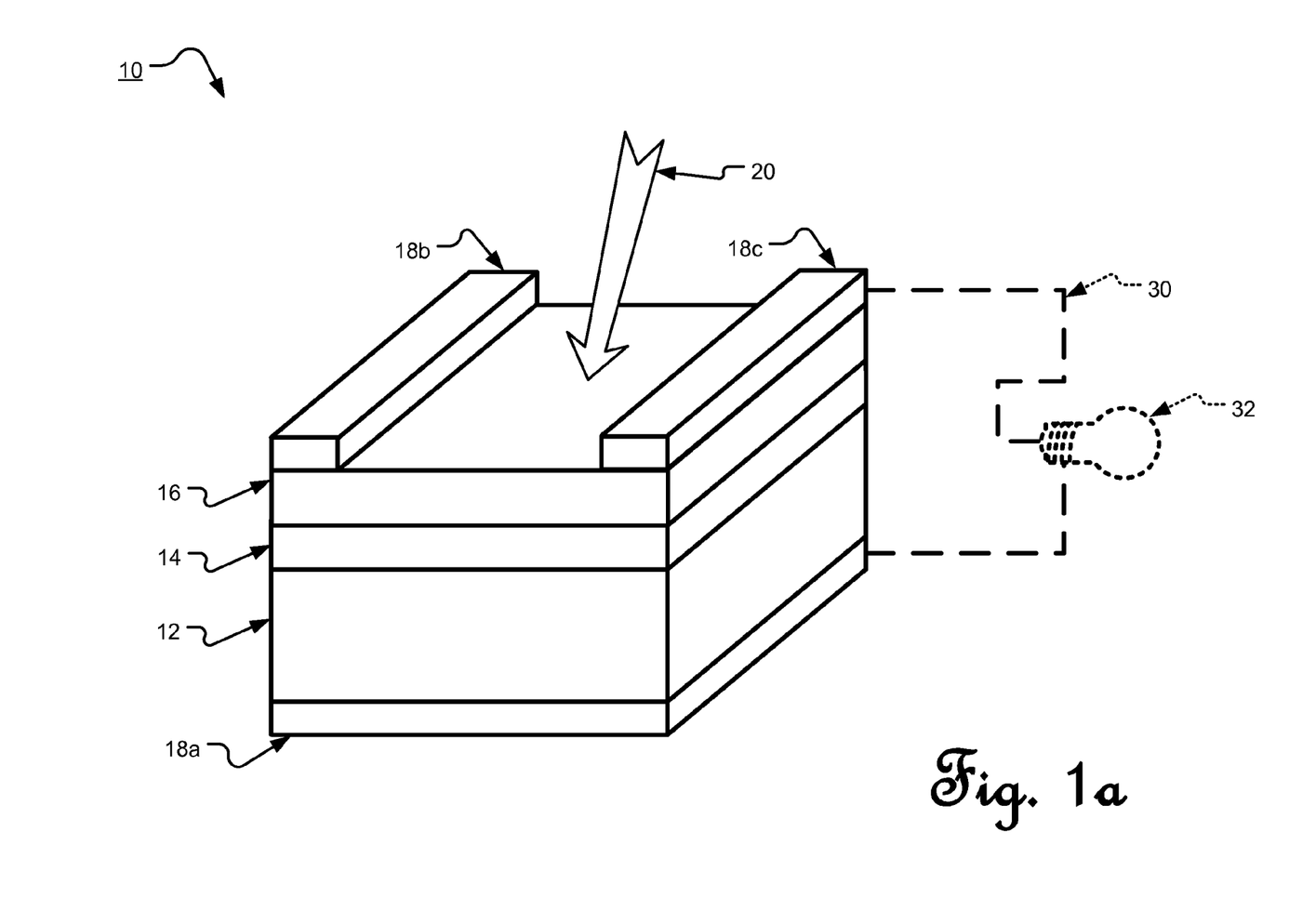
Figure 1B:
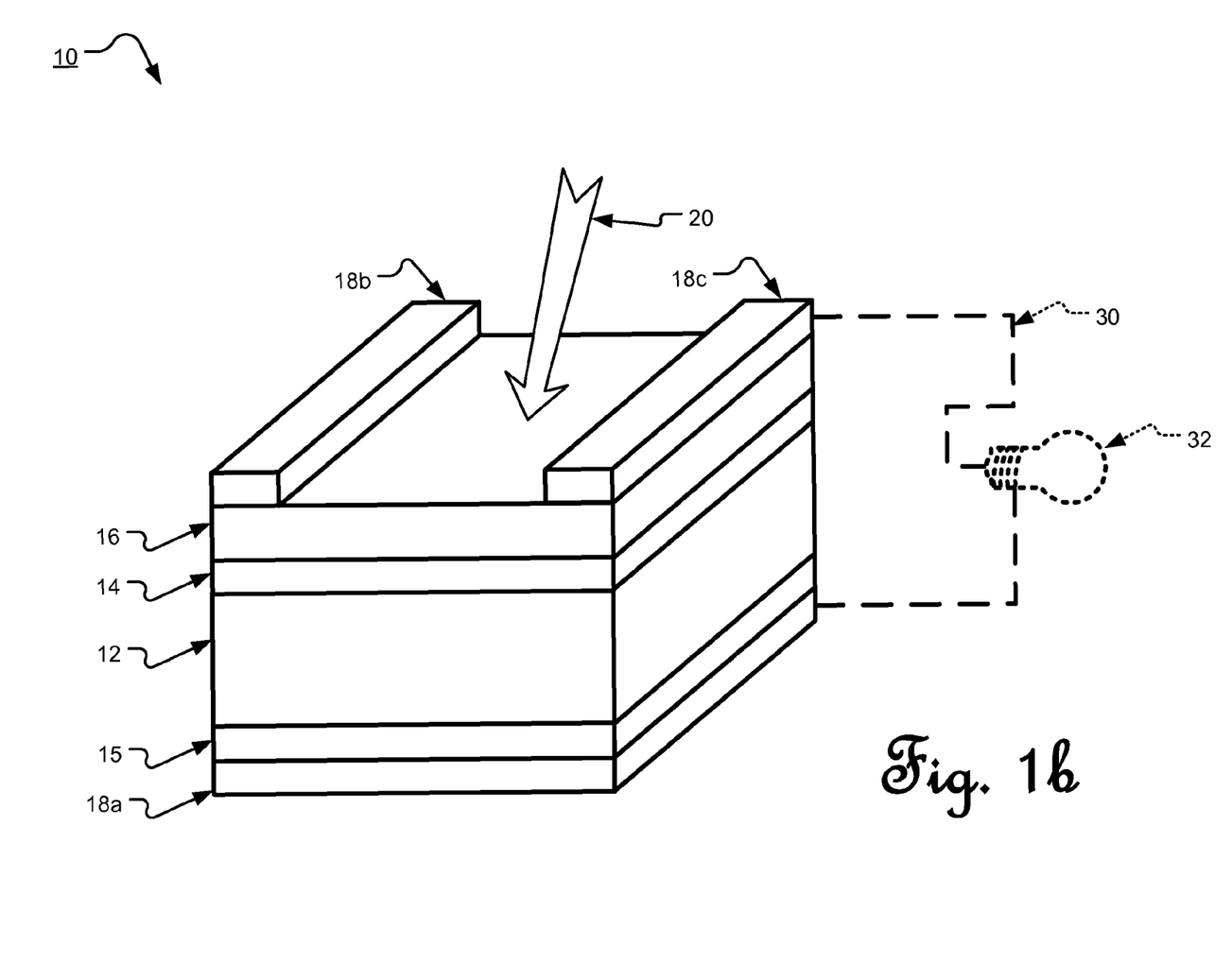

FIG. 1 provides two schematic views, the first, FIG. 1a providing a schematic view of a semi-conductive device hereof, typically a photovoltaic or solar cell 10. Such a cell 10 may generally include a substrate layer 12, typically a silicon (Si) wafer, upon which is formed a junction layer 14, over which here has been formed a passivation layer 16. Conductive contacts 18, particularly back side contact 18a and front side contact grid elements 18b and 18c are also shown as these may complete a circuit 30, shown in dashed lines, to power a load 32, also shown in an exemplar form in dashed lines. In an alternative implementation, an alternative and/or additional layer 15 may be formed as a junction layer on the back side as shown in FIG. 1b (layer 15 being shown between substrate 12 and back contact 18a). Thus, a junction may be formed as a layer on either or both sides of layer 12 as will be described in further detail below. Note, though the contact grid represented by elements 18b and 18c is shown upon the passivation layer 16, this grid could be formed before the passivation layer, with the passivation layer deposited thereover and thus disposed thereon.

Layers 12 and 14 and, if used, layer 15, may be semi-conductive and form opposing parts of a p-n junction, which in many instances may be useful in photovoltaic electricity generation. In such a circumstance, one or more appropriate in-coming light/electro-magnetic waves or photons 20 may pass through the passivation layer 16 and impact and/or otherwise energize movement of electrons, a phenomenon known as the photovoltaic or photoelectric effect (where a material (e.g., metal or silicon) emits electrons when hit by photons). The moving electrons may then move as a current through the respective front and back contacts 18 and the circuit 30, and thus provide power to a load 32. Note, the photoelectric effect may include the photogeneration of charge carriers, whether of electrons and/or electron holes (the positive charge opposite of an electron, formed by the absence of an electron, also movable in the sense that when moving electrons leave and fill holes, the holes thus moving in the opposite direction of the electrons).

In many implementations hereof the layers 12, 14, 15 and/or 16 may be of silicon, typically silicon with another material. P-type and n-type semi-conductor layers formed from silicon may be, as known, doped with materials such as boron or phosphorus or other metal organics. In particular, p-type silicon may be created by doping with materials such as Boron or gallium. In such case, silicon (which has four valence electrons) may be doped with materials having atoms that have one less valence electron (three valence electrons), such as Boron, having only three electrons being available for bonding with four adjacent silicon atoms, therefore an incomplete bond (electron hole) exists which can attract an electron from a nearby atom. Filling one hole with an electron creates another hole in a different Si atom. This movement of holes is available for conduction. Similarly, n-type silicon is created by doping the Si with compounds that contain one more valence electron than Si does, such as with either Phosphorus or Arsenic. Since only four electrons are required to bond with the four adjacent silicon atoms, the fifth valence electron is available for conduction. Either of the p-type or n-type could form the substrate layer 12, (substrate layer referring generally to the stratified disposition or arrangement of layers and not necessarily connoting a formed layer as for example a deposited layer) with the corresponding opposite or opposing type forming the deposited layer 14 (FIG. 1a); however, more typically, the p-type layer will be the substrate. Otherwise, it may be that an additional or alternative deposited layer 15 (FIG. 1b) may be formed on the back side of the substrate, this being more typically a p-type layer. Moreover, the substrate layer may typically be a wafer as often may be wire sliced from an ingot or, in some other instances may be a thin-film or other layer as deposited on a further base layer (not shown) (note also this substrate may be initially silicon only doped, or doped in or before formation of the ingot). Note, for the deposition for the substrate/p-type layer as well, as shown by the embodiment of FIG. 1b, the example may be a structure of an n+/Si layer on a p-type wafer with a p+ layer. All the + layers may be grown from HWCVD, and may include an Aluminum or other metal contact layer, regardless the order of deposition, i.e., deposit p-type, then deposit n-type, or vice versa.

Note, either of layers 12 or 14 (or 15) may be the p-type or n-type semi-conductor layer; though often the substrate 12 will be the p-type having been previously doped with boron (or like substance, see above). For example, silicon doped with boron is known even in or before the wafer formation phase (not addressed in detail here) if wafers are used as the substrates 12. Then, the deposited layer 14 would be the n-type layer. If used, the deposited layer 15 may then often be the p-type layer.

The passivation layer 16 may typically be a silicon product with oxygen or nitrogen; more particularly silicon oxide (SiO$_2$) or silicon nitride (SiN$_x$), most typically being a silicon nitride. As described further below, such a layer may be, as is known, a passivation layer or an anti-reflection layer or both or may provide other advantages or features (dielectric in thin-film, conformal coating in microelectronics, or water-resistance, among others). Note, though the passivation layer is not limited to SiNx only, it can be any working layer with a preference for being depositable using HWCVD. Currently; SiNx has shown use in production.

The conductive contacts 18 may typically be a metal such as aluminum or silver (or others). The front contact member may be disposed in direct contact (not shown) with the semi-conductive layer 14, and/or 15, if used. If not, the front metal such as Ag can diffuse through the SiNx layer to contact the front junction during the co-firing or annealing operation. Note, with either or both of deposited type layers 14 and/or 15, or a metal contact layer 18 may be co-fired with these layers, these layers potentially crystallizing during firing (c-Si or poly-Si), with the metal annealing and potentially also diffusing into the silicon to form a silicide, as for example, an aluminum silicide, which could aid in electrical conductivity through formation of better electrical contact between layers (higher performances may be achieved with such formations).

Other layers or materials may also be incorporated as for example, an additional clear or light transmissive protective layer (not shown) such as glass or plastic to protect the cell from environmental concerns (wind, water or others).

In many instances, the processes and semi-conductors resulting herefrom will find applicability in production of or resulting in solar cells. Thus, typically, silicon will be the base materials used for the substrate and the n-type and/or p-type deposition, though doped. Even so, i.e., that these will typically be Si based solar cells, other materials for junction and/or passivation formation may be used, though as above, the passivation layer may be less limited to a silicon base, e.g., not SiNx only. As a further note, for solar cells, crystalline silicon, both c-Si (mono) and poly-Si may be preferred, with little, if any difference in the processes and/or results herefrom.

Figure 2:
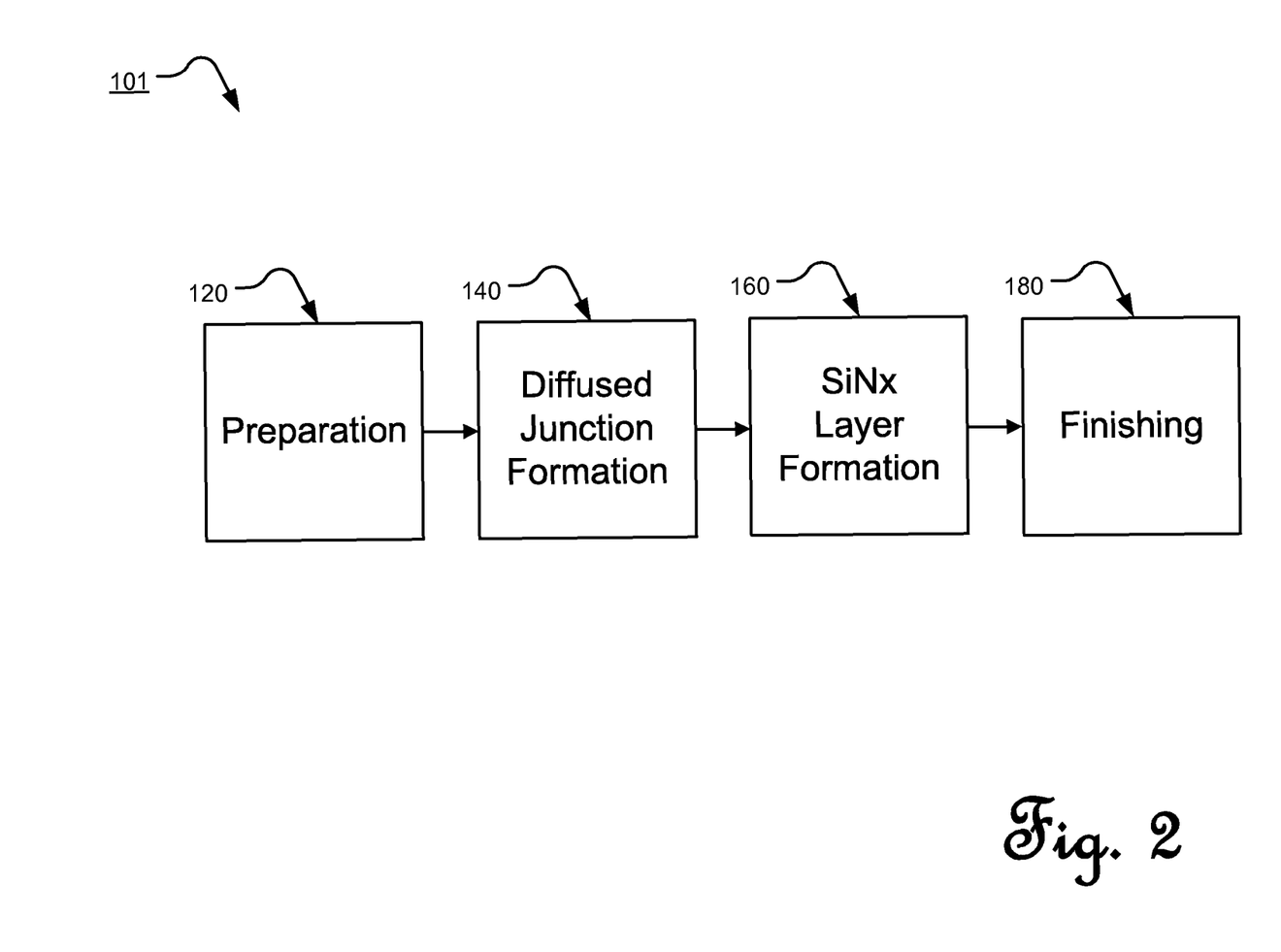
FIG. 2 is a schematic flow chart of a process for fabricating semi-conductive devices.

FIG. 2 provides a flow diagram which illustrates a generally known process 101. In this process one or more preparatory operations 120 are performed, these typically including cleaning the substrate and/or texturing it for the later formation operations. Then, the n-type or p-type junctions are formed as indicated by the operation identified with the reference numeral 140. In conventional processes, this has typically been a high temperature (800-900° C.) batch diffuse furnace process involving introduction of a phosphoryl chloride (commonly called phosphorus oxychloride), or $POCl_3$, into the furnace having a number of P-type (typically boron-doped) silicon wafers disposed therein. $POCl_3$ has been used as a safe liquid/gas phosphorus source in diffusion processes. The phosphorus acts as a dopant used to create an N-type semi-conductor layer with the silicon wafer by diffusion of the phosphorus into the silicon wafer heated in the diffuse furnace. As mentioned, the wafer would have been pre-formed with a boron or like dopant for the P-type layer. Then, after phosphorus diffusion, the wafers with junctions formed therein are removed from such a furnace, and then a thin film silicon nitride ($SiN_x$) layer may be formed as shown by the operation identified with the reference numeral 160 in FIG. 2. This may have been by any of a variety of operations, though the benefits of hot-wire CVD (HWCVD, also known as catalytic CVD or cat-CVD) have recently been described. Lastly, one or more finishing operations 180 may be performed, as for example forming contacts, typically silver (Ag) contacts and annealing or co-firing (in annealing, the dopant atoms, usually boron, phosphorus or arsenic, can be incorporated into substitutional positions in the silicon crystal lattice, resulting in drastic changes in the electrical properties of the semiconducting material; the metal contacts may also benefit from the annealing process through crystallization or better electrical connection to the semi-conductor layers).

Figure 3:
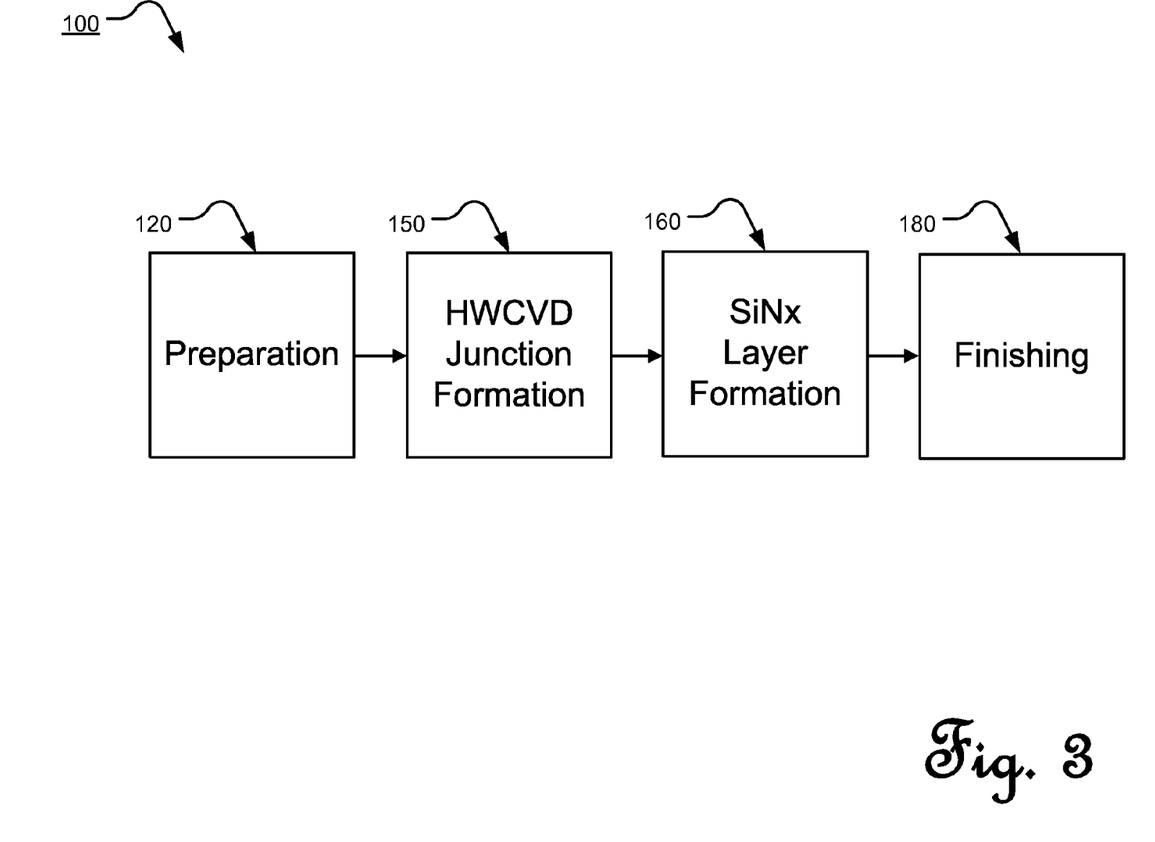
FIG. 3 is a schematic flow chart of an alternative process for fabricating semi-conductive devices.
Figure 4:
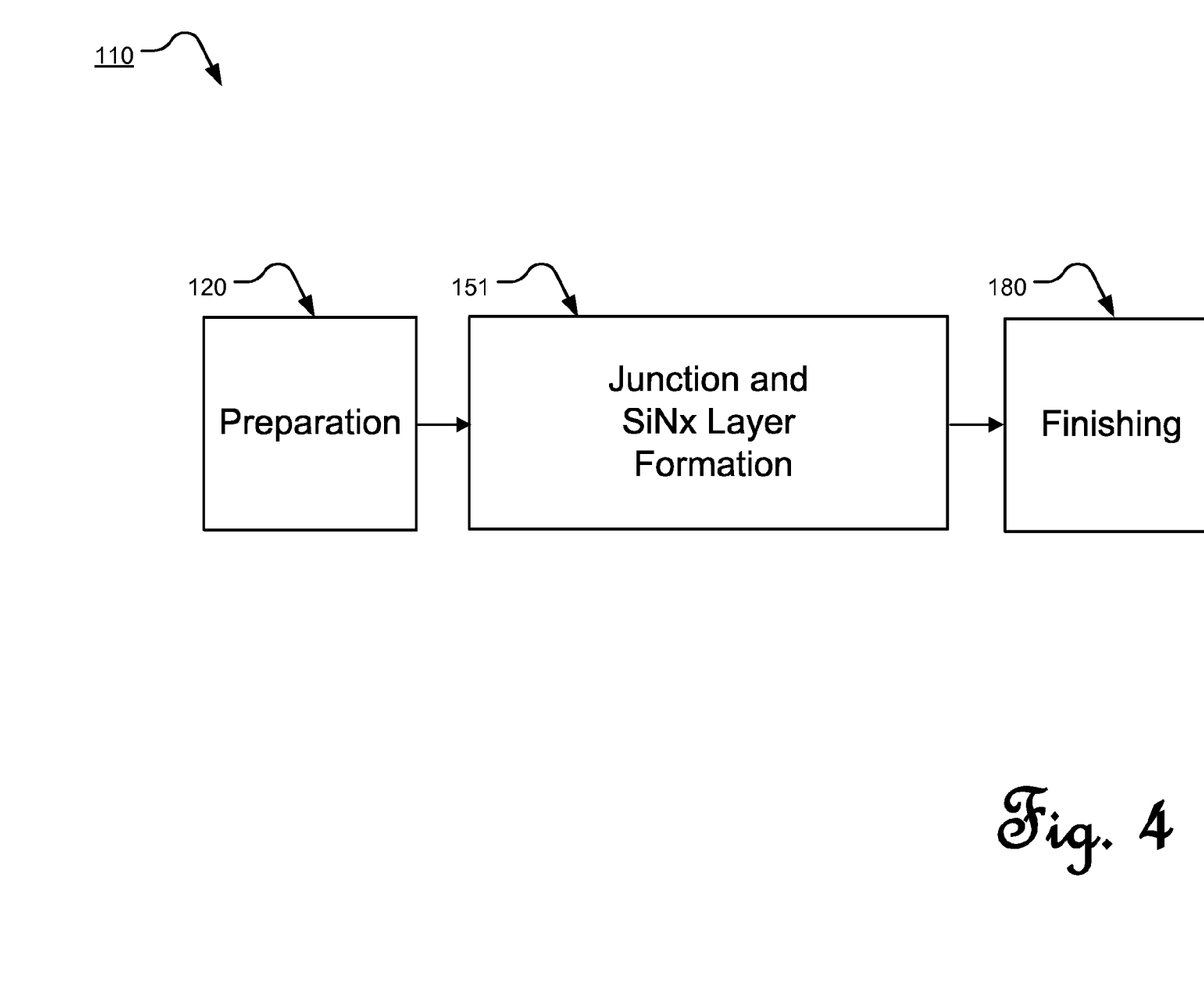
FIG. 4 is a further schematic flow chart of another alternative process for fabricating semi-conductive devices.

Alternative processes are presented next in FIGS. 3 and 4 for the efficient fabrication of semi-conductor cells, as for example photovoltaic or solar cells, e.g., particularly, highly efficient c-Si and/or poly-Si solar cells using low temperature growth of c-Si and/or poly-Si junctions (homo or hetero) and $SiN_x$ passivation layers by the HWCVD technique. The combination of forming junctions (homo or hetero) and an $SiN_x$ passivation layer using the same growth method at low temperature may have great advantages of high throughput and low cost for c-Si and poly-Si based solar cell manufacturing. The HWCVD technique can be scaled up to fit the needs of mass production. In particular in FIG. 3, the process 100 differs from the process 101 of FIG. 2 by the substitution of a junction formation operation 150 which is of the HWCVD or other deposition type. Thus, the wafer is not transformed by diffusion as in FIG. 2, but, has an additional layer formed/deposited thereon. Thereafter, an SiNx layer is formed via operation 160, typically as before. However, FIG. 4 provides a further alternative where by an operation 151, the junction and the SiNx layers may be formed in what may appear as a single step. Thus, the process 110 of FIG. 4 is a general three-phase operation; involving, preparation 120, layer formation 151 (for both the junction and the SiNx passivation layers), and finishing 180. Note, particularly with the contact formation, a contact may be added to the back side of the substrate as a preparatory operation prior to the deposition operation or operations (depositions being on the front side of the substrate), and need not be performed as a finishing operation.

Figure 5:
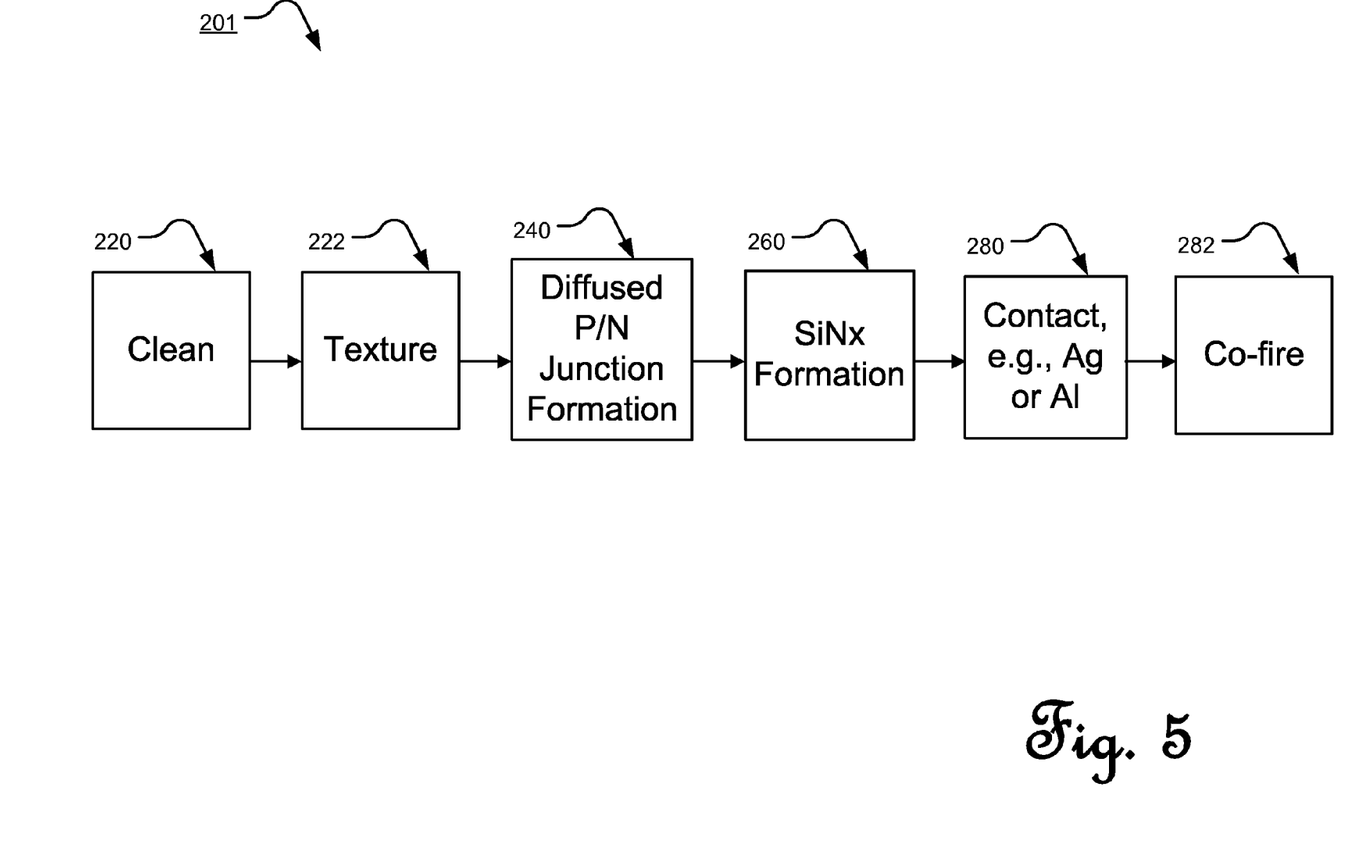
FIG. 5 is a still further schematic flow chart of a process for fabricating semi-conductive devices.
Figure 6:
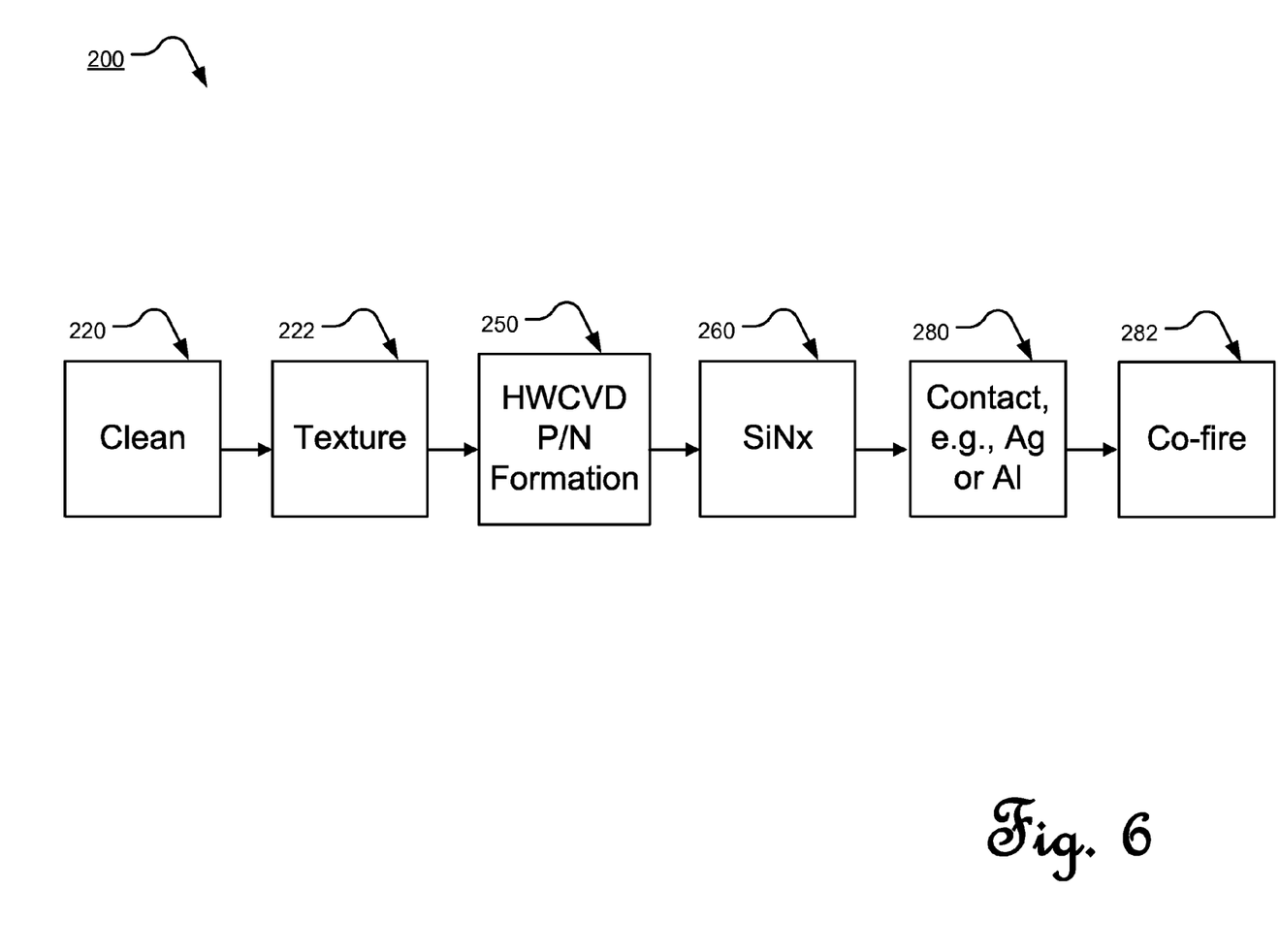
FIG. 6 is another schematic flow chart of yet another alternative process for fabricating semi-conductive devices.

FIGS. 5, 6 and 7 illustrate further details in alternative formation processes. For example, the process 201 of FIG. 5 shows a known process including the preparatory steps of cleaning 220 and texturing 222 a substrate before the diffusion junction formation step 240. A passivation layer formation operation 260 follows with the contact 280 and annealing/co-firing step 282 finishing operations coming thereafter. By contrast, the process 200 of FIG. 6 includes the alternative deposition junction formation operation 250 instead of the diffusion step 240. In a further alternative implementation 210 as shown in FIG. 7, a single combined operation 251 for forming the junction and the passivation layers replaces the two silicon deposition operations 250 and 260 (junction formation 250 and passivation formation 260) of FIG. 6. Here also, contact formation on the back side of the substrate may be preparatory or finishing. Further examples of systems herefor will be described further below.

An example method provides for the vapor phase growth of one or more silicon films on a single crystal or poly-crystal substrate using silane gas, wherein the process is carried out at a temperature of approximately or less than about 220° C. More particularly, an n-type semi-conductor layer of silicon doped with phosphorus may be formed by the HWCVD technique by flowing silane gas ($SiH_4$) and phosphine ($PH_3$) across a hot wire or other hot element/filament over a p-type silicon substrate. Phosphine would be used to form an n-type junction on a p-type substrate; whereas, alternatively, an exemplar gas of diborane ($B_2H_6$) might be used as an alternative to form a p-type deposition on a n-type substrate. As above, the diborane would be mixed with silane. A hydrogen ($H_2$) gas may be added to the process as well (with either phosphine or diborane). Silane and ammonia gas ($NH_3$), optionally with hydrogen gas, may then similarly passed across a hot wire over the substrate to form the passivation layer over the junction layers.

More particularly for example; single crystal, p-type, c-Si based homo and heterojunction solar cells were processed in the following way: A p-type silicon wafer was cleaned using an HF solution. The wafer was loaded into a hot-wire CVD chamber for forming the junction. In homo-junction formation, the wafer was heated to about 650° C. The n-type junction layer was then formed by a HWCVD process, depositing the n-type epi-silicon by the gaseous mixture of 20 sccm (standard cubic centimeters per minute) of $SiH_4$ and 3 sccm of $PH_3$ at 11 mTorr at 2000° C. filament temperature. The thickness of the n-layer was in a range of between about 100-500 nm. In heterojunction formation, the wafer was heated to about 250° C. Atomic hydrogen generated from the HWCVD process was used to further clean the wafer surface for a brief time, i.e. 1-5 min by using $H_2$ flow of 70 sccm, 30 mTorr, at 2000° C. filament temperature. Then, a brief deposition of 20 sccm $SiH_4$ at 10 mTorr was provided to form a thin buffer layer on the wafer (about 10 nm). The n-type junction layer was then formed depositing the n-type thin film silicon by the gaseous mixture of 3 sccm of $SiH_4$, 3 sccm of $PH_3$, and 40 sccm of $H_2$ at 25 mTorr, the layer formed in a range of between about 10-100 nm.

A silicon nitride, $SiN_x$, passivation layer can be deposited either after the forming of the junctions, as for example after the n-layer (or, in some instances after metal grid formation). A 700 Å SiNx layer with dark blue color may be preferable. In the continuation of the above example, the process was performed at about 220° C. substrate temperature with a mixture of 2.5 sccm of $SiH_4$, 3 sccm of $NH_3$ and 40 sccm of $H_2$ at 25 mTorr pressure. This $SiN_x$ passivation layer was deposited immediately after the n-layer. Therefore, the time between the cooling down and heat up of the wafer for the metal grids is saved. Moreover, the same or a different HWCVD chamber and/or hot-wire element or filament may be used.

The low temperature junction and/or passivation films may be produced according to the methods hereof using any suitable chemical vapor deposition hot-element apparatus, as will be understood readily by persons skilled in the art upon gaining an understanding of the features of this exemplary process disclosed herein. However, to facilitate the explanation of this process, suitable apparatuses and/or systems are illustrated in FIGS. 8, 9, 10 and 11.

As introduced above, the processes hereof provide for depositing a junction layer on a crystalline substrate. A system and method for use thereof may generally include the operations of providing a chamber having an element capable of heating for CVD, introducing the substrate into the chamber, heating the element at a temperature sufficient to decompose a source gas, passing the source gas in contact with the element; and forming a junction and/or passivation layer on the substrate.

Figure 8:
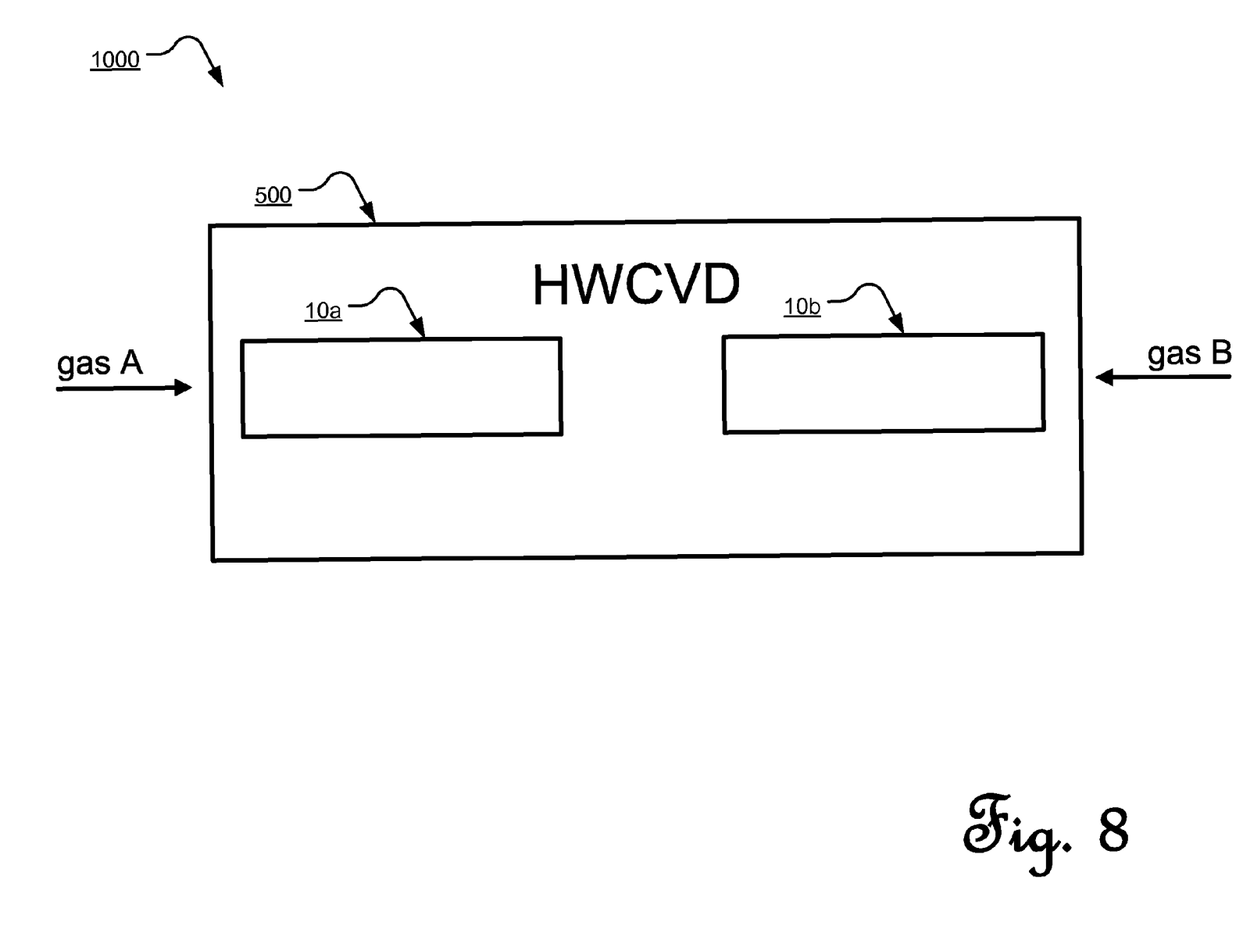
FIG. 8 is a schematic elevational view of a suitable hot-element deposition chamber for growing a junction and/or a passivation layer according hereto.

Referring now to the drawing figures, in FIG. 8 an elevational schematic view of a suitable apparatus or system 1000 for carrying out the exemplary method is shown. A hot-element chemical vapor deposition chamber 500 is shown with two exemplar substrates or wafers 10a and 10b disposed therein. The Figure demonstrates schematically how a single chamber 500 may allow for the introduction therein of a first source gas A and second source gas B, for the deposition of junction and passivation layers on one or more substrates. The term "source gas" means that gas which decomposes on the hot-element. As described above a mixture of a silane and a phosphine with optional hydrogen may be used as a source gas A for deposition of an n-type layer on a p-type substrate. As used here, the term "silane" may include a gas species comprising the elements silicon and hydrogen. By this method a single crystalline thin-film junction may be formed on a semiconductor substrate when the silane phosphine gas mixture is carried onto a single crystalline silicon substrate to form a doped silicon thin-film. The source gas B may be, as also described above, a silane with ammonia and optional hydrogen. By this method a thin-film passivation layer may be formed on a semiconductor layer when the silane ammonia gas mixture is carried onto the silicon substrate.

Figure 9:
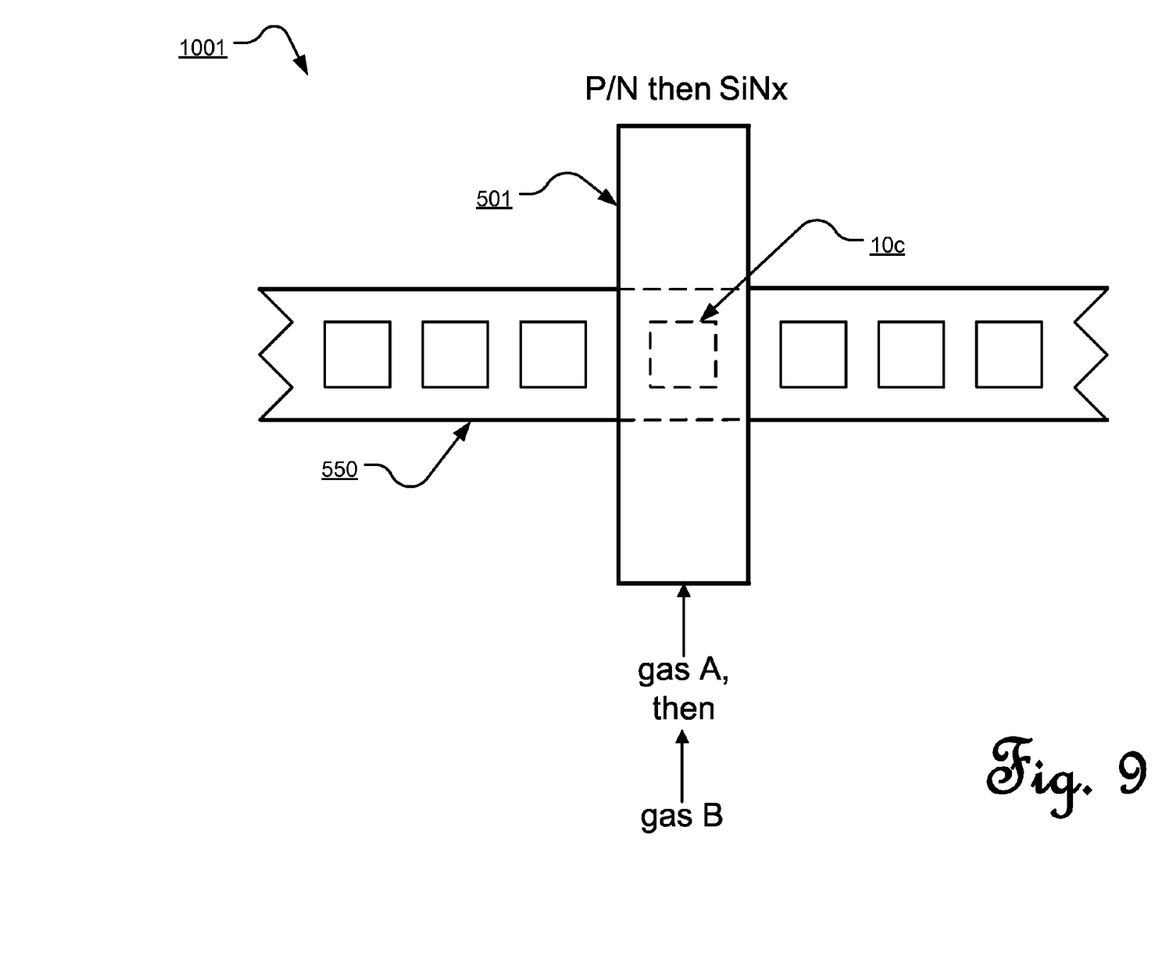
FIG. 9 is a schematic plan view of a suitable hot-element deposition chamber and system for growing a junction and/or a passivation layer according hereto.

Referring now to FIG. 9, a conveyor based system 1001 is shown with a chamber 501 for deposition of materials on a substrate 10c. As indicated schematically, the substrate moves on a conveyance apparatus or conveyor 550 into the chamber 501 where a first source gas A is introduced for formation of a junction layer on the substrate. Then, schematically shown is the option of secondarily introducing a source gas B into the chamber 501 for formation of a passivation layer on the substrate over the deposited junction layer. Note, though source gases A and B are shown schematically being introduced from different inlets in FIG. 8, and from the same, or substantially the same inlet area in FIG. 9; either option may be available in practice.

Figure 10:
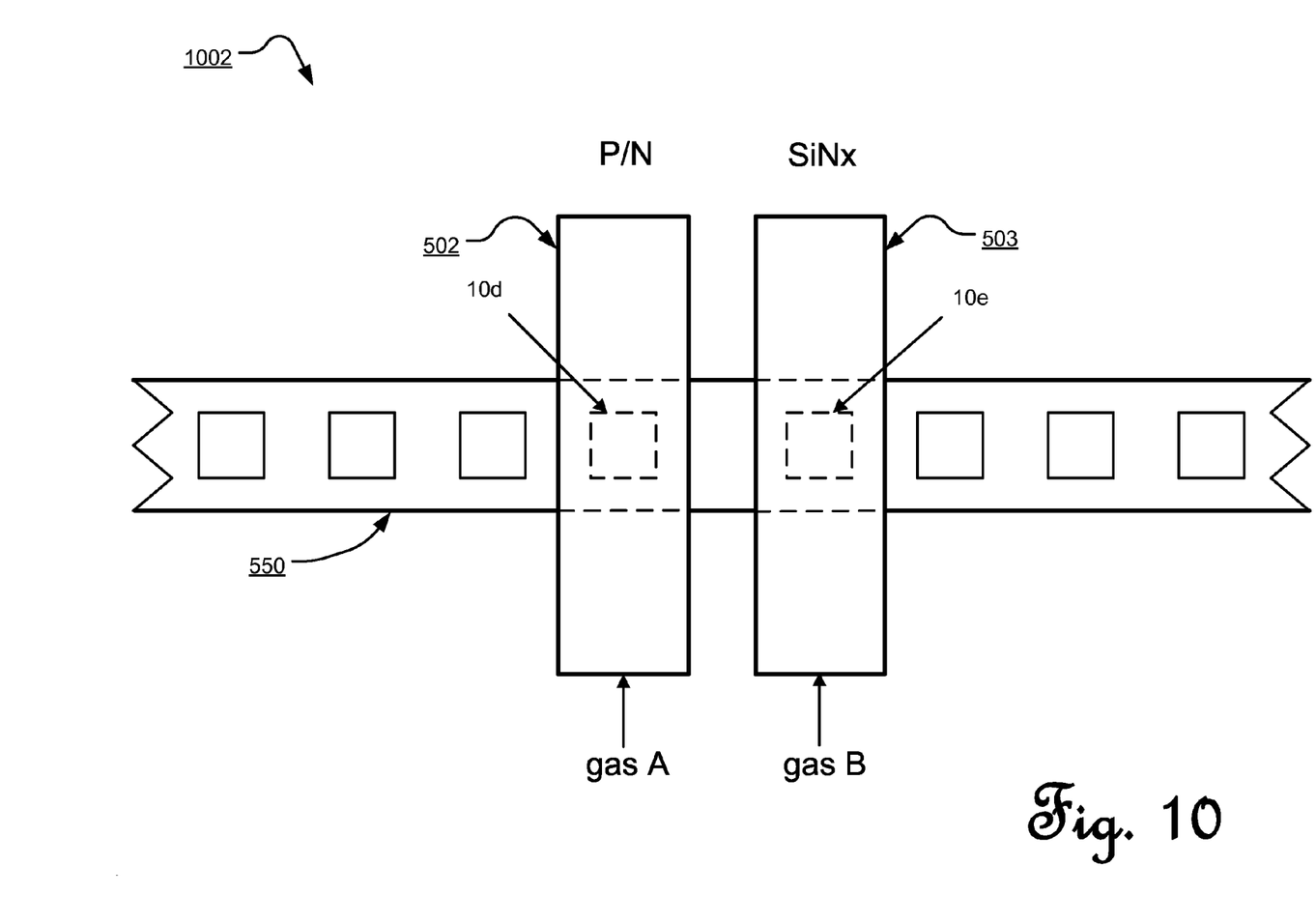
FIG. 10 is another schematic plan view of an alternative suitable hot-element deposition chamber and system for growing a junction and/or a passivation layer according hereto.

Referring next to FIG. 10, a two chamber system 1002 is shown. Here, deposition of a junction layer proceeds by first placing the substrate 10d within the chamber 502. As shown in FIG. 10, the source-gas A is allowed to flow into chamber 502 and in passing over a hot-wire element deposits a layer on the substrate. The source-gas A, such as silane, including a dopant such as phosphine, forms the doped junction layer. Then, the substrate may be moved via a conveyor 550 into a second chamber, here a chamber 503 for formation of a passivation layer. Here, a substrate 10e is schematically shown receiving deposition from the decomposition products of a source gas B introduced into chamber 503. Note, separate chambers, or indeed, even a third chamber in between (not shown) could provide for an additional cooling step in between (or perhaps a step of applying a contact grid, with heating and then cooling).

Figure 11:
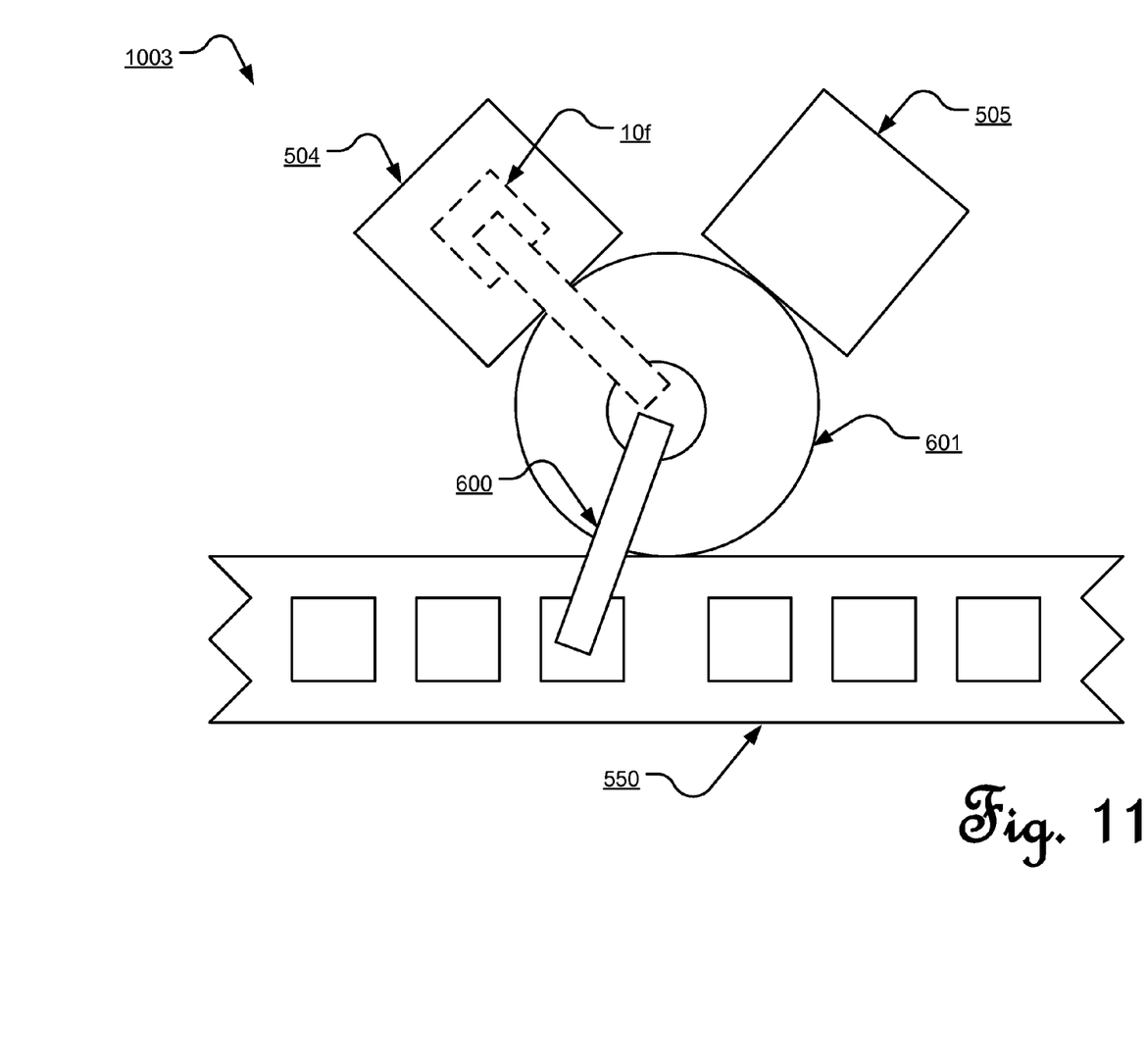
FIG. 11 is yet another schematic plan view of a further alternative suitable hot-element deposition system for growing a junction and/or a passivation layer according hereto; and, FIG. 12 is a graph of relative thickness of a junction layer vs. the concentration of dopant therein.

A further alternative system 1003 is shown in FIG. 11. Here, a robotic arm 600 moving on a turntable 601 (or other support or device moving system) may be used to move a wafer from a conveyor 550 to a first chamber 504 for junction formation, see e.g., the exemplar wafer 10f disposed in chamber 504 for this purpose. A second chamber 505 is shown for the formation of passivation layers; however, the passivation layer might also be performed within the same initial chamber 504.

Note, many alternative apparatuses and/or systems may be used as well. A potential feature of many implementations hereof is rapidity of the manufacturing process over that of prior operations, particularly over those involving diffusion of a dopant into a wafer substrate. With HWCVD, a wafer per second on a conveyance system is not unreasonable throughput. Other CVD methods would likely be slower, indeed it may be that other CVD processes may not be amenable to belt conveyance apparatus, as for example with plasma-enhanced CVD (PECVD) (note, thought hot-wire is described throughout, other CVD processes may be effective, as for example, thermal CVD, PE CVD, or microwave CVD, etc.; however, HWCVD may grow higher quality junctions). Moreover, though conveyor based systems may be one way of achieving the higher throughput and lower costs afforded for deposition junction formation for c-Si and poly-Si based solar cell manufacturing, other methods, systems and or apparatuses may be available upon the CVD junction formation bases. The CVD techniques hereof, particularly HWCVD can be scaled up to fit the needs of mass production, thus forming a cost savings in manufacturing.

Figure 12:
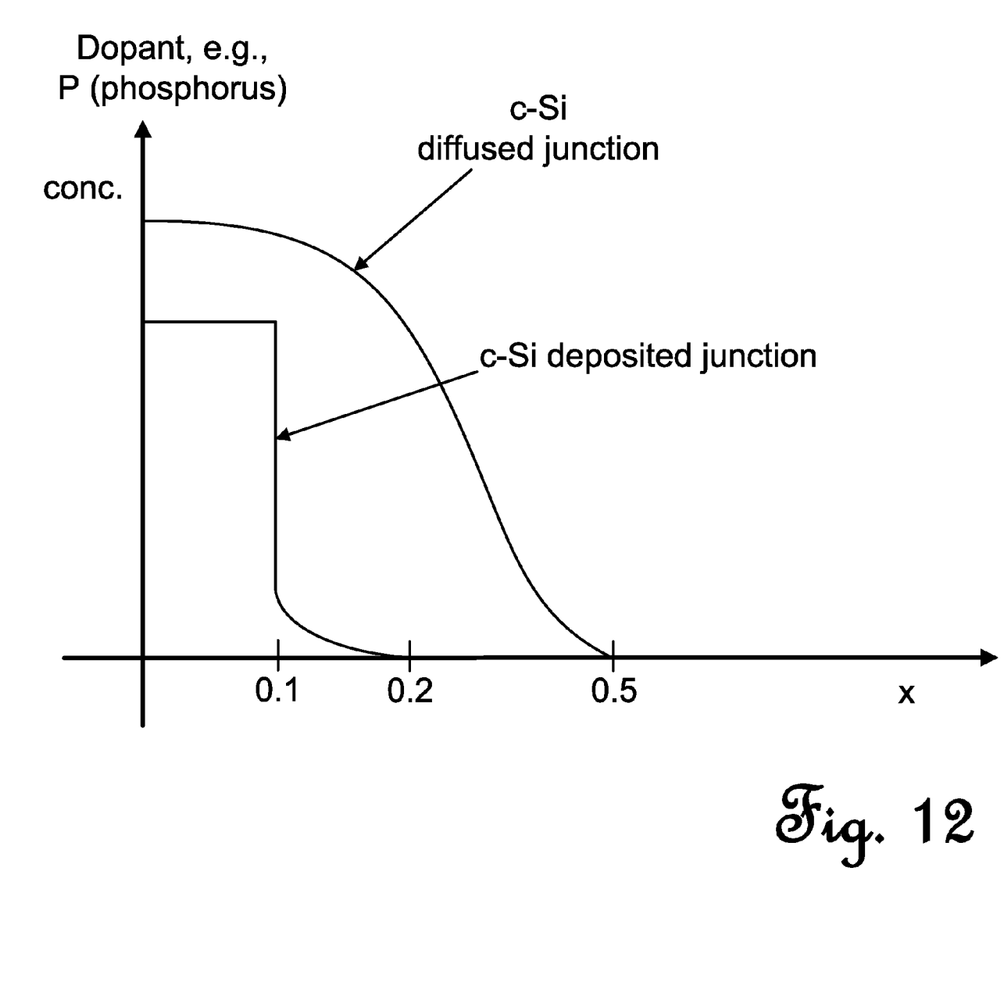

Other features and/or advantages might also be realized herefrom. For example, lower temperatures during manufacturing might provide advantages in operating efficiency or lifetimes. It may be that higher diffusion furnace temperatures could negatively affect substrates in terms of operating efficiency or longevity. Moreover, better control over the formation of the junction layer and relative dopant concentration and/or location might be achieved hereby. FIG. 12 is a graph of relative layering in the diffuse process versus the present HWCVD process. More particularly, shown is the relative thickness or depth of a junction layer versus the concentration of dopant. In particular, what is shown is that in a wafer with a diffused junction formation, the concentration of the dopant varies greatly from the surface through to the furthest depth reached by phosphorus atoms (phosphorus doping used here as an exemplar only). Where, on the other hand, the deposition process for formation of a junction layer would provide a substantially constant concentration of dopant atoms to a desired depth, i.e., the 100 Å shown (0.1 on the graph of FIG. 12), but for a bit of diffusion naturally present at or nearer the boundary with the p-type layer, i.e., at the depletion region (shown by the tail between 0.1 and 0.2 in FIG. 12). This would result in better productivity of the product solar cell.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A process for forming a semi-conductor comprising;
preparing a substrate for deposition of a junction layer;
forming the junction layer using hot wire chemical vapor deposition to deposit the junction layer on the substrate, wherein the deposition of the junction layer is performed at a substrate temperature equal to or less than 220 C and wherein the process for forming a semi-conductor does not include an annealing or diffusion step; and
forming a passivation layer after the forming of the junction layer, the forming of the passivation layer including using a hot-wire chemical vapor deposition technique to form the passivation layer;
wherein the forming of the junction layer and the forming of the passivation layer are performed as a single operation in a single deposition chamber.

2. A process according to claim 1 further including forming a solar cell from the semi-conductor formed by the substrate with the junction layer deposited thereon.

3. A process according to claim 1 wherein in the forming operation, the junction layer deposited is one or the other of an n-type and a p-type semi-conductor.

4. A process according to claim 1 wherein in the forming operation, the junction layer deposited is one or the other of an n-type semi-conductor deposited upon a p-type substrate, and a p-type semi-conductor deposited upon an n-type semi-conductor.

5. A process according to claim 1 wherein the preparing operation includes providing a doped silicon substrate.

6. A process according to claim 1 wherein the forming operation includes forming a doped silicon junction layer.

7. A process according to claim 1 wherein the forming operation includes using a silane gas with a dopant gas to form a doped silicon junction layer.

8. A process according to claim 1 wherein the forming operation includes using a silane gas with a dopant gas to form a doped silicon junction layer, and wherein the dopant gas includes one or more of phosphine, phosphorus, arsenic or boron.

9. A process according to claim 1 wherein the forming operation includes forming a silicon-based passivation layer.

10. A process according to claim 1 wherein the forming operation includes using a silane gas with a passivation gas to form a silicon-based passivation layer.

11. A process according to claim 1 wherein the forming operation includes using a silane gas with a passivation gas to form a silicon-based passivation layer, and wherein the passivation gas includes ammonia.

12. A process according to claim 1 wherein one or both of the preparing and forming operations includes connecting a conductive contact.

13. A process according to claim 1 further including a finishing operation which includes connecting a conductive contact, and wherein the conductive contact is connected to the junction layer.

14. A process according to claim 1 further including a passivation layer forming operation and a finishing operation which includes connecting a conductive contact, and wherein the conductive contact is connected to one or both of the junction layer and the passivation layer.

* * * * *